(12) United States Patent
Landers et al.

(10) Patent No.: US 10,310,129 B2
(45) Date of Patent: Jun. 4, 2019

(54) SENSOR DEVICES AND METHODS FOR CALCULATING AN ORIENTATION WHILE ACCOUNTING FOR MAGNETIC INTERFERENCE

(71) Applicant: Yost Labs Inc., Portsmouth, OH (US)

(72) Inventors: Stephen P. Landers, Portsmouth, OH (US); Paul W. Yost, Portsmouth, OH (US); David Rieksts, South Portsmouth, KY (US)

(73) Assignee: YOST LABS INC., Portsmouth, OH (US)

( * ) Notice: Subject to any disclaimer, the term of this patent is extended or adjusted under 35 U.S.C. 154(b) by 1100 days.

(21) Appl. No.: 14/674,336

(22) Filed: Mar. 31, 2015

(65) Prior Publication Data

US 2015/0204994 A1    Jul. 23, 2015

Related U.S. Application Data

(63) Continuation of application No. PCT/US2014/049895, filed on Aug. 6, 2014.
(Continued)

(51) Int. Cl.
*G01V 3/08* (2006.01)
*G01C 21/08* (2006.01)
(Continued)

(52) U.S. Cl.
CPC ............. *G01V 3/08* (2013.01); *G01C 19/00* (2013.01); *G01C 21/08* (2013.01); *G01C 21/165* (2013.01); *G01R 33/0064* (2013.01)

(58) Field of Classification Search
CPC .......... G01V 3/08; G01C 19/00; G01C 21/08; G01C 21/165
See application file for complete search history.

(56) References Cited

U.S. PATENT DOCUMENTS 6,407,999 B1    6/2002  Olkkonen et al.
8,498,827 B2    7/2013  Yost
(Continued)

FOREIGN PATENT DOCUMENTS

WO    2015021122    2/2015

OTHER PUBLICATIONS

International Search Report and Written Opinion dated Nov. 19, 2014 in PCT/US2014/049895, filed on Aug. 6, 2014.

*Primary Examiner* — Janet L Suglo
(74) *Attorney, Agent, or Firm* — Edell, Shapiro & Finnan, LLC

(57) ABSTRACT

Sensor devices and methods for calculating an orientation of a sensor device including a magnetometer are disclosed. In one embodiment, a method of computing an orientation of a sensor device includes receiving a current magnetic field reading including at least a magnetic field magnitude, calculating a difference between the current magnetic field magnitude and a reference magnetic field magnitude, and comparing the difference between the current magnetic field magnitude and the reference magnetic field magnitude with a threshold. The method further includes adjusting a trust value of the magnetometer such that the trust value is decreased if the difference between the current magnetic field magnitude is greater than or equal to the threshold, and computing an orientation of the sensor device based at least on the trust value and the current magnetic field reading, wherein the trust value affects a reliance on the magnetic field reading in computing the orientation.

18 Claims, 4 Drawing Sheets

Related U.S. Application Data

(60) Provisional application No. 61/862,699, filed on Aug. 6, 2013.

(51) Int. Cl.
    *G01C 19/00*     (2013.01)
    *G01C 21/16*     (2006.01)
    *G01R 33/00*     (2006.01)

(56) References Cited

U.S. PATENT DOCUMENTS

| | | |
|---|---|---|
| 9,354,058 B2 | 5/2016 | Yost |
| 2008/0052034 A1* | 2/2008 | David ............... G01C 21/16 702/151 |
| 2010/0312513 A1 | 12/2010 | Mayor et al. |
| 2012/0130652 A1 | 5/2012 | Yost |
| 2012/0166134 A1 | 6/2012 | Yost |
| 2012/0197590 A1 | 8/2012 | Landers et al. |
| 2013/0191067 A1 | 7/2013 | Reed et al. |
| 2013/0311129 A1 | 11/2013 | Yost |
| 2018/0058857 A1 | 3/2018 | Yost |

* cited by examiner

SENSOR DEVICES AND METHODS FOR CALCULATING AN ORIENTATION WHILE ACCOUNTING FOR MAGNETIC INTERFERENCE

CROSS REFERENCE TO RELATED APPLICATIONS

This application is a continuation of International Patent App. No. PCT/US2014/049895, entitled "Sensor Devices And Method For Calculating An Orientation While Accounting For Magnetic Interference," filed Aug. 6, 2014, which claims the benefit of U.S. Provisional Patent Application Ser. No. 61/862,699, entitled "Detecting Interference In Magnetometer Measurements To Determine Confidence In Sensor," filed Aug. 6, 2013, the entire disclosures of which are hereby incorporated herein by reference.

TECHNICAL FIELD

The present application relates to sensor device and, more particularly, sensor devices and methods for calculating an orientation that account for magnetic interference.

SUMMARY OF INVENTION

Many systems incorporate sensors to measure directional physical quantities. Such sensors may include, but are not limited to, multi-axis magnetometers, multi-axis accelerometers, sonar arrays, radar arrays, and the like.

However, sensors can exhibit inaccuracies stemming from a variety of sources. For example, a multi-axis magnetometer may exhibit inaccuracies from imperfections in the sensor itself (scale/bias, sensor non-linearity, cross-axis effect, etc.), as well as from magnetic field distortion due to soft-iron effects of nearby ferrous system components or hard-iron effects of nearby magnetic sources such as motors, speakers, current carrying conductors, and the like. Magnetic interference from such sources can substantially reduce the accuracy of the magnetometer output. In such cases, it may be useful to rely more heavily or fully on the other sensors provided within the sensor device.

FIGS. 1A-1C illustrate a moving sensor device 100 that passes near a magnetic field source 190 that generates a magnetic field 192. For most orientation sensing applications wherein the sensor device includes one or more accelerometers, one or more gyroscopes and one or more magnetometers, it may be ideal to use all of the sensors of the sensor device 100 when the sensor device 100 of FIG. 1A is outside of the magnetic field generated by source 102. Use of all of the sensors of the sensor device 100 may provide more information and allow a higher degree of accuracy. However, when inside a magnetic field 192 as illustrated in FIG. 1B, as described in more detail herein, the magnetic field readings detected by the magnetometer of the sensor device 100 may be corrupted by the magnetic fields 192 such that the sensor device 100 may no longer accurately detect the Earth's magnetic fields. When the sensor device 100 passes completely by the magnetic source 190 and the magnetic field 192 as shown in FIG. 1C, its readings may no longer be influenced significantly by the magnetic field 192.

It may be beneficial to trust the information from the magnetometer less, and to only have a high trust in the sensors which are not affected by such magnetic fields 192 when the sensor device is within a magnetic field as illustrated in FIG. 1B. Further, it may also be beneficial to switch back to using all sensors of the sensor device 100 when the instrument moves back out of the magnetic field 192 as illustrated in FIG. 1C.

Sensor devices may utilize a filter, such as a Kalman filter, to generate an output. Many such filters have a parameter indicating how much magnetometer readings should influence the output. This influence is referred to herein as a trust level, T. The trust level T may range from a minimum value to a maximum value. In one embodiment, the minimum trust value is zero and the maximum trust value is one, with one indicating that the magnetometer values are totally trusted, and zero indicating the magnetometer values should not be used at all when computing the output. It should be understood that the trust level concepts described herein are for illustration, and the actual filter parameter this represents may not range from zero to one.

Embodiments of the present disclosure improve accuracies of sensor devices despite the influence of external magnetic fields by comparing current magnetic field magnitudes with a reference magnetic field magnitude. A trust value with respect to the readings of the magnetometer is decreased when a difference between the current magnetic field magnitude and the reference magnetic field magnitude is greater than a threshold such that the magnetometer is trusted less when influenced by a magnetic field. The trust value may be increased following a waiting period wherein the difference between the current magnetic field magnitude and the reference magnetic field magnitude is less than the threshold.

In one embodiment, a sensor device, a sensor device includes a magnetometer operable to produce a magnetic field reading including at least a magnitude of a magnetic field, a processor, wherein the processor is communicatively coupled to the magnetometer, and a non-transitory computer-readable memory storing instructions. The instructions, when executed by the processor, cause the processor to receive a current magnetometer reading including at least a current magnetic field magnitude as detected by the magnetometer, calculate a difference between the current magnetic field magnitude and a reference magnetic field magnitude, compare the difference between the current magnetic field magnitude and the reference magnetic field magnitude with a threshold, adjust a trust value of the magnetometer such that the trust value is decreased if the difference between the current magnetic field magnitude is greater than or equal to the threshold, compute an orientation of the sensor device based at least on the trust value and the current magnetic field reading, wherein the trust value affects a reliance on magnetic field readings in computing the orientation of the sensor device, and provide an output signal, wherein the output signal indicates the orientation of the sensor device.

In another embodiment, a method of computing an orientation of a sensor device includes receiving a current magnetic field reading including at least a magnetic field magnitude as detected by a magnetometer, calculating a difference between the current magnetic field magnitude and a reference magnetic field magnitude, and comparing the difference between the current magnetic field magnitude and the reference magnetic field magnitude with a threshold. The method further includes adjusting a trust value of the magnetometer such that the trust value is decreased if the difference between the current magnetic field magnitude is greater than or equal to the threshold, and computing an orientation of the sensor device based at least on the trust value and the current magnetic field reading, wherein the trust value affects a reliance on the magnetic field reading in computing the orientation of the sensor device.

BRIEF DESCRIPTION OF THE DRAWINGS

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate various embodiments described herein, and together with the description serve to explain the principles and operations of the claimed subject matter.

DESCRIPTION OF EMBODIMENTS

Embodiments of the present disclosure are directed to sensor devices and methods for computing an orientation of a sensor device that accounts for the presence of magnetic fields. When an external magnetic field is proximate the sensor device and interferes with a magnetometer of the sensor device, the magnetometer is trusted less when computing the orientation of the sensor device. When no external magnetic field is proximate the sensor device, the magnetometer may be fully trusted. More specifically, a current magnetic field magnitude is compared to a reference magnetic field magnitude, which commonly corresponds to the magnitude of the Earth's magnetic field in the geographic location of the sensor device, but could correspond to any given local magnetic field. A trust value associated with the magnetometer is lowered when the difference between the current magnetic field magnitude and a reference magnetic field magnitude is greater than a threshold, such as when an external magnetic field is proximate the sensor device. In such a manner, the magnetometer is trusted less when the sensor device is in the presence of an external magnetic field. The trust value associated with the magnetometer may be increased if the difference between current magnetic field magnitude and the reference magnetic field magnitude is less than the threshold for a predetermined period of time. Various sensor device and methods for computing an orientation of a sensor device are described in detail below.

Figure 1A:
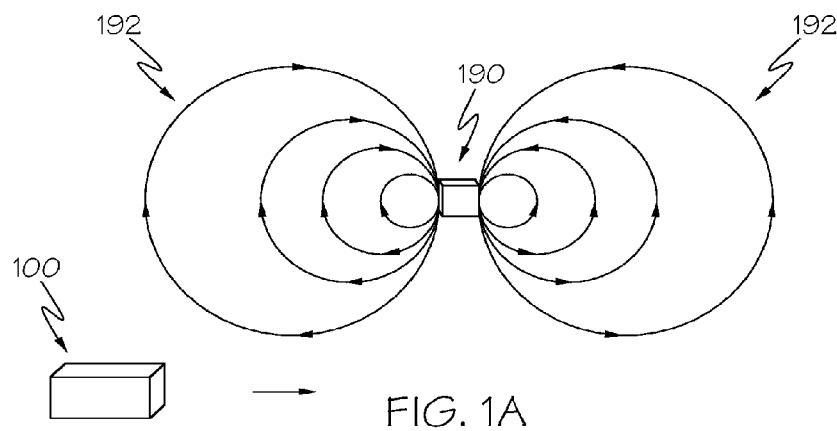
FIG. 1A schematically depicts a sensor device approaching a magnetic field source.
Figure 1B:
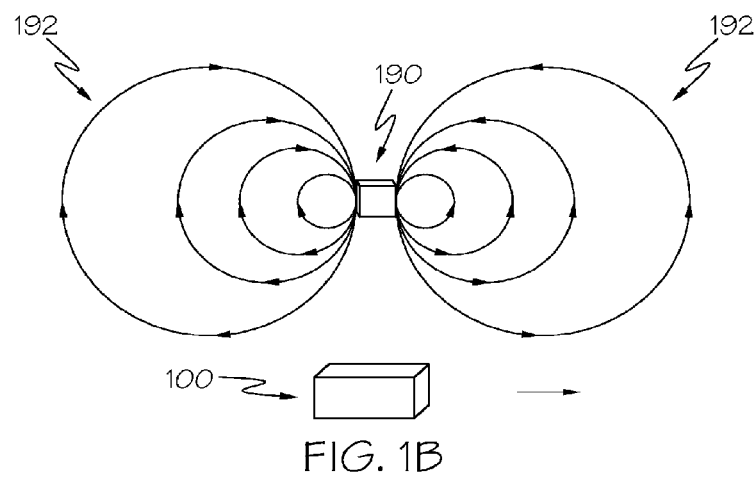
FIG. 1B schematically depicts a sensor device within a magnetic field produced by the magnetic field source depicted in FIG. 1A.
Figure 1C:
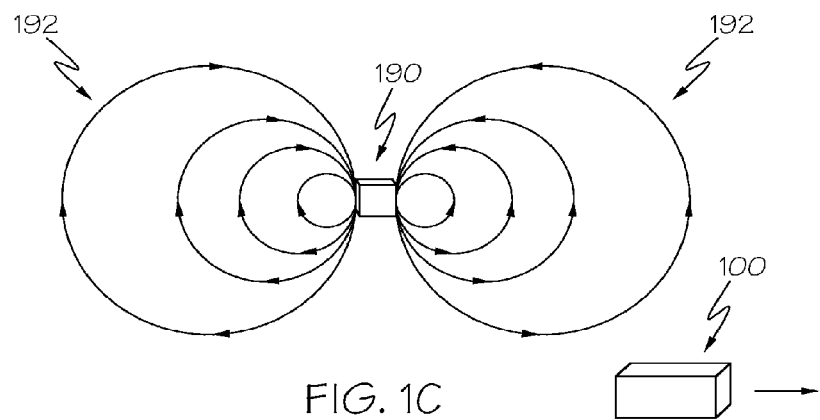
FIG. 1C schematically depicts a sensor device leaving a magnetic field produced by the magnetic field source depicted in FIGS. 1A and 1B.
Figure 2:
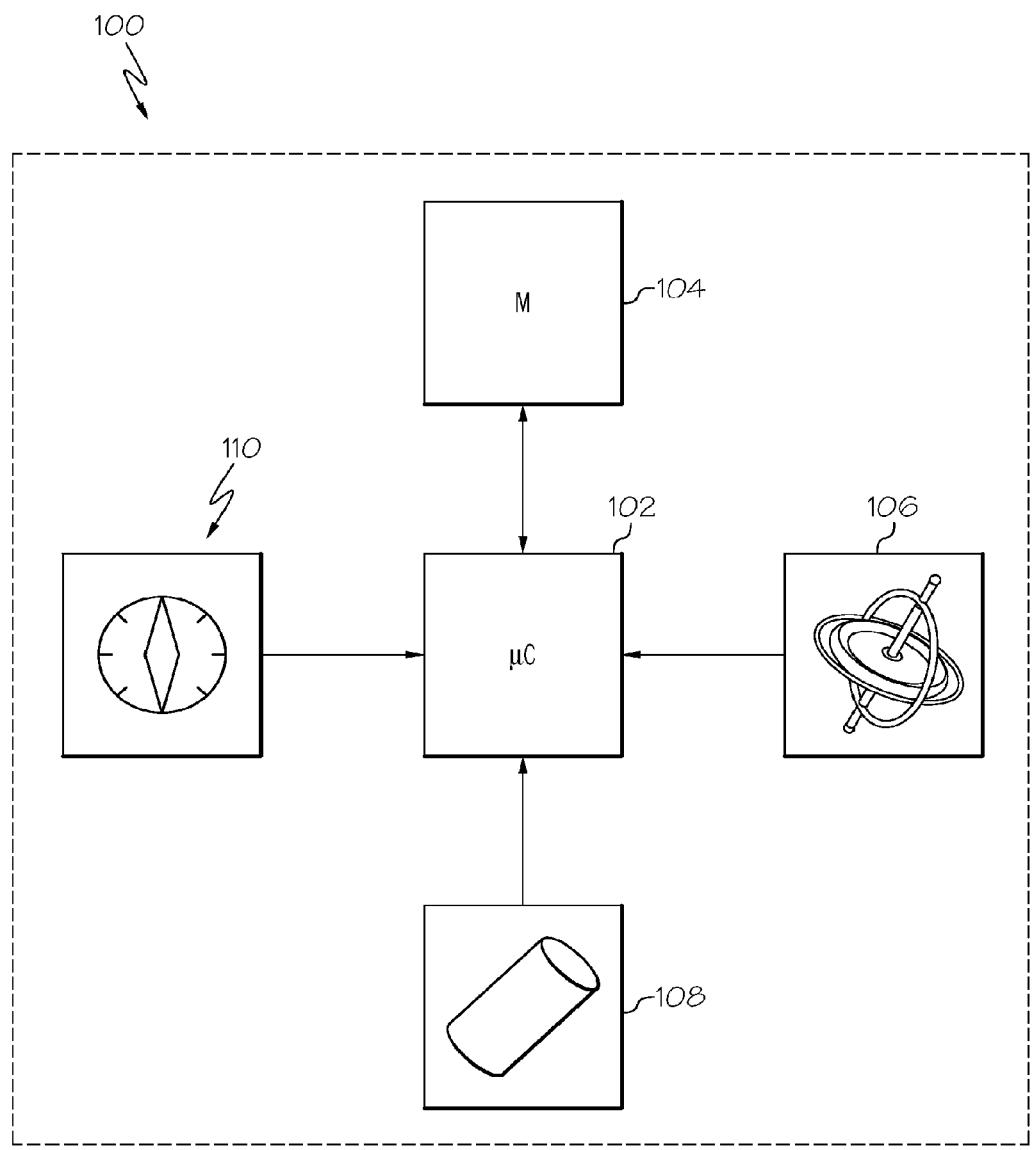
FIG. 2 schematically depicts an example sensor device according to one or more embodiments described and illustrated herein.

Referring now to FIG. 2, internal components of an exemplary sensor device (e.g., the sensor device 100 depicted in FIGS. 1A-1C) is schematically illustrated. More particularly, FIG. 2 depicts a sensor device 100 for estimating an orientation of the sensor device 200 (and/or the orientation of an object or device incorporating the sensor device 200) embodied as hardware, software, and/or firmware, according to embodiments shown and described herein. It is noted that computer-program products and methods for correcting the output of the sensor device 200 may be executed by any combination of hardware, software, and/or firmware.

The sensor device 100 illustrated in FIG. 2 comprises a processor 102, a non-transitory computer-readable memory 104 (which may store computer readable instructions (i.e., software code) for performing the various functionality described herein, such as computing orientation of the sensor device, for example), at least one magnetometer 110 (e.g., a multi-axis magnetometer), at least one gyroscope 106 (e.g., a multi-axis gyroscope sensor), and at least one accelerometer 108 (e.g. a multi-axis accelerometer sensor). Each of the illustrated components may be communicatively coupled to the processor 102 (e.g., by a communication bus,) which may be configured as any processor, micro-controller, or the like, capable of executing computer readable instructions stored in the memory 104 or otherwise provided as software and/or firmware.

More or fewer sensors may be utilized. In the embodiments described herein, only a single magnetometer 110 is required. Any combination of any number of magnetometers 110, accelerometers 108 and gyroscopes 106 may be provided within the sensor device 100. For example, the sensor device 200 may include only one sensor. It should be understood that the components illustrated in FIG. 2 are merely exemplary and are not intended to limit the scope of this disclosure.

The non-transitory computer-readable memory 104 may be configured as nonvolatile computer readable medium and, as such, may include random access memory (including SRAM, DRAM, and/or other types of random access memory), flash memory, registers, compact discs (CD), digital versatile discs (DVD), magnetic disks, and/or other types of storage components. Additionally, the non-transitory computer-readable memory 104 may be configured to store, among other things, computer readable instructions, one or more look-up tables, the time delay table described below, and any data necessary to compute the orientation outputs of the sensor device 100 described below.

As stated above, the processor 102 may include any processing component configured to receive and execute instructions (such as from the non-transitory computer useable memory 104). It is noted that the orientation calculations described herein may be effectuated by the processor 102 as software instructions stored on the non-transitory computer useable memory 104, as well as by any additional controller hardware, if present (not shown). In some embodiments, the additional controller hardware may comprise logic gates to perform the software instructions as a hardware implementation. The processor 102 may be configured as, but not limited to, a general-purpose microcontroller, an application-specific integrated circuit, or a programmable logic controller.

The sensor device 100 may be incorporated into larger systems, and may be able to communicate with external devices and components of such systems via input/output hardware (not shown). The input/output hardware may include any hardware and/or software for sending and receiving data to an external device, such as an output signal corresponding to an orientation estimation of the sensor device 100. Exemplary input/output hardware includes, but is not limited to, universal serial bus (USB), FireWire, Thunderbolt, local area network (LAN) port, wireless fidelity (Wi-Fi) card, WiMax card, and/or other hardware for communicating with other networks and/or external devices.

As described in more detail below, each of the one or more gyroscopes 106, the one or more accelerometers 108 (if provided), and the one or more magnetometers 110 (if provided) may be configured to provide a signal to the processor 102 (or other components of the sensor device 100) that corresponds with a physical quantity that represents a physical orientation of the sensor device 100. The signal or data from the various sensors 106, 108, 110 may be provided to the processor 102 and/or additional controller hardware. For example, the accelerometer 108 may be configured to provide a signal/data that corresponds to its orientation relative to gravity, while the magnetometer 110 may be configured to provide a signal/data that corresponds to its orientation relative to magnetic North, and the gyroscope 106 may be configured to provide a signal/data that corresponds to its position with respect to x-, y- and z-axes. The accelerometer 108, the gyroscope 106, and the magnetometer 110 may be configured as any proprietary, currently available, or yet-to-be-developed sensor device. It should be understood that the sensor device 100 may include any combination of magnetometers 110, accelerometers 108 and/or gyroscopes 106 (or other sensors that output a sensor vector corresponding to orientation).

Figure 3A:
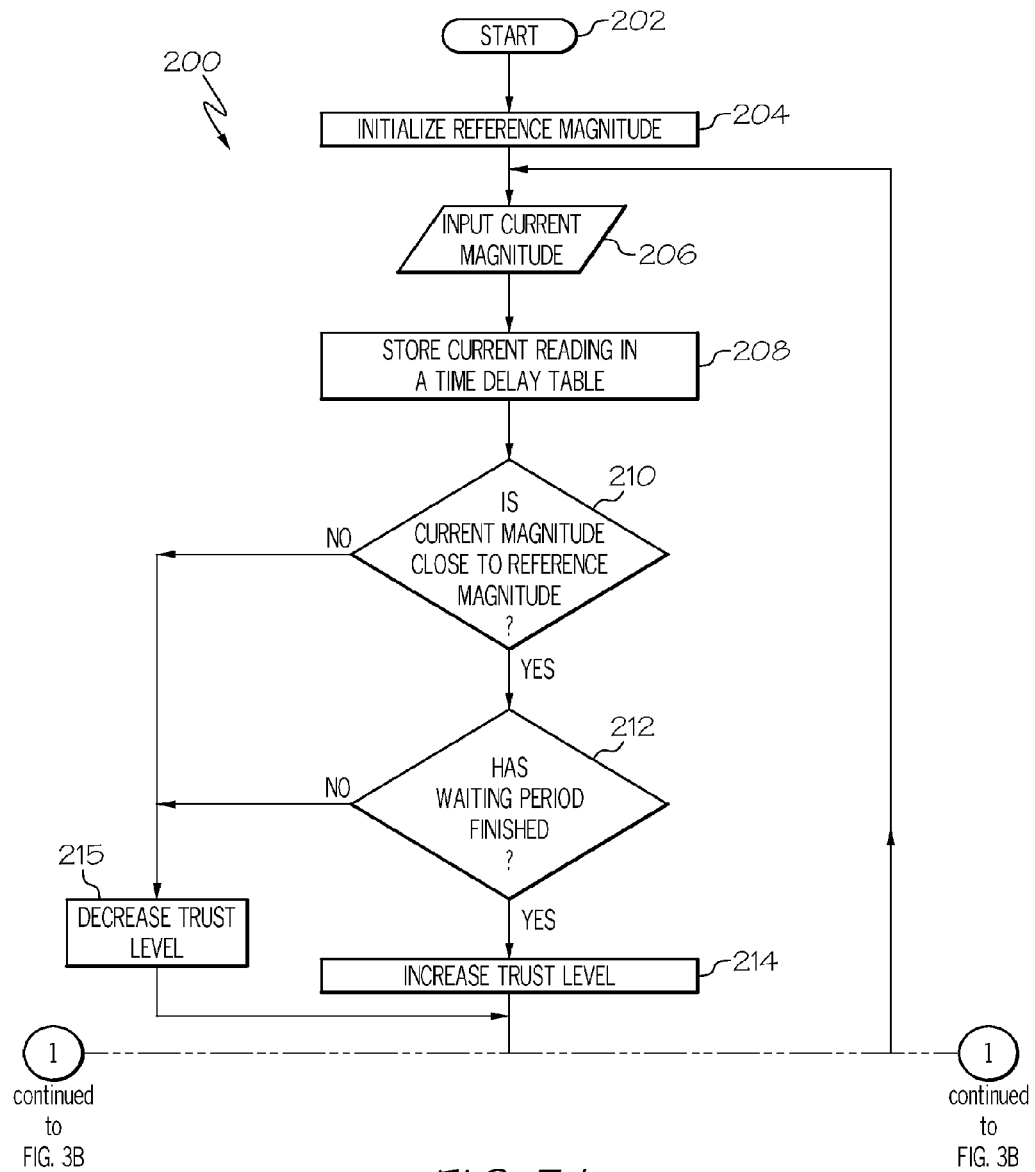
FIGS. 3A and 3B schematically depict an example method for calculating an orientation of a sensor device according to one or more embodiments described and illustrated herein.
Figure 3B:
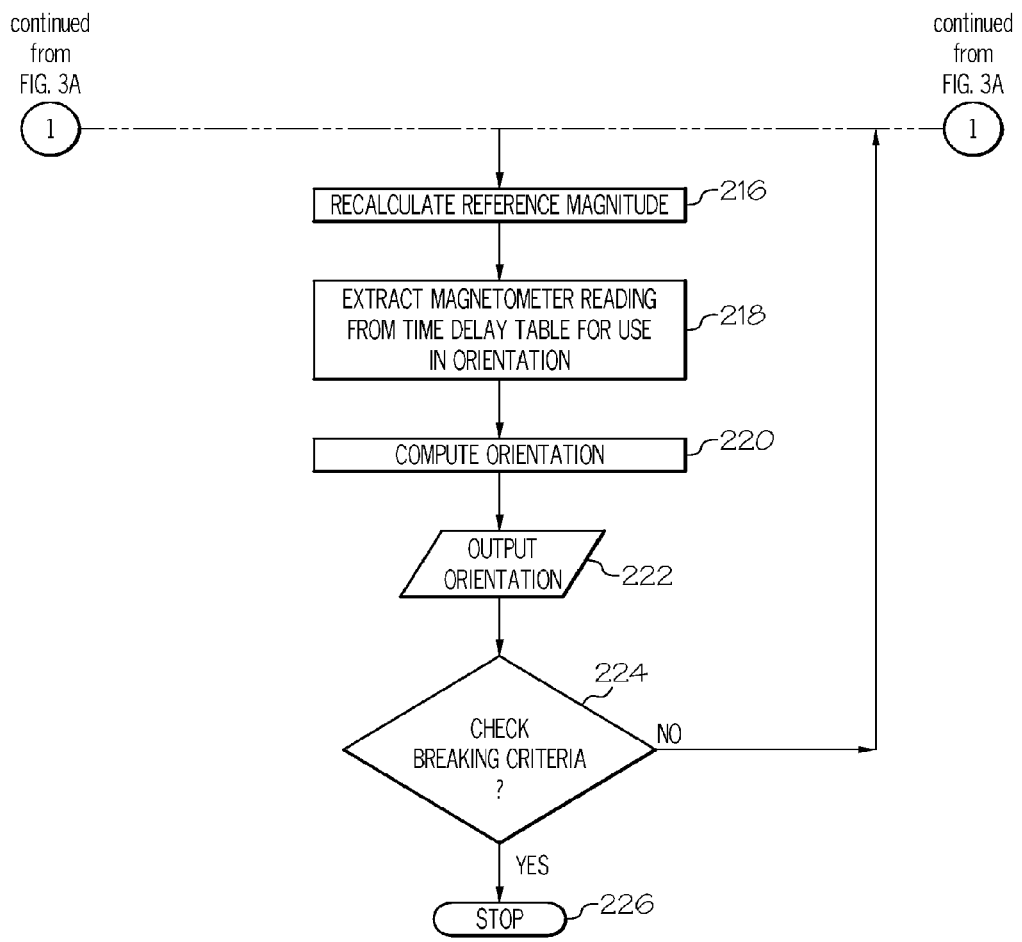

Referring now to FIGS. 3A and 3B, a method of calculating an orientation of a sensor device 100 including at least one magnetometer 110 is graphically illustrated in a flowchart 200. Generally, the process is started, a reference magnetic field magnitude is initiated, and a current magnetic field magnitude from a magnetic field reading generated by the magnetometer 110 is determined and stored (blocks 202, 204, 206, and 208). It is noted that each magnetic field reading generated by the magnetometer 110 includes both a magnetic field direction and a magnetic field magnitude. Next, a current magnetic field magnitude is compared to the reference magnetic field magnitude to determine if the difference is greater than or less than a threshold (i.e., is the current magnetic field magnitude close to the reference field magnitude) (blocks 210, 212, 214 and 215). If the difference between the current magnetic field magnitude and the reference magnetic field magnitude is greater than the threshold, then the trust value of the magnetometer(s) 110 is decreased at block 215. If the difference between the current magnetic field magnitude and the reference magnetic field magnitude is less than the threshold and a waiting period has expired, then the trust value is increased at block 214.

Using the magnetic field readings of the magnetometer(s) 110 and the trust value, as well as the readings of the gyroscope(s) 106 and the accelerometer(s) 108, if provided, the orientation of the sensor device is computed and provided as an output signal (blocks 216, 218, 220, 222, 224, and 226). Decreasing the trust value applied to the magnetometer reduces or eliminates the influence of the magnetic field readings of the magnetometer 110 on the output signal corresponding to the orientation of the sensor device 100. When the trust value of the magnetometer is low (e.g., zero), the influence of the accelerometer(s) 108 and gyroscope(s) 106, if provided, is increased. In this manner, the disruption caused by the external magnetic field does not corrupt the computed orientation of the sensor device 100.

Details regarding the process depicted the flowchart 200 shown in FIGS. 3A and 3B are provided below.

Reference Magnitude

In some embodiments, the reference magnetic field magnitude is obtained by averaging the magnitudes of a certain number of previous readings from the magnetometer 110. This average should be initialized outside of significant magnetic interference before detection of such interference is attempted. The magnitude of the magnetometer reading provides a measure of the strength of the magnetic field. Because the Earth's magnetic field is relatively weak in comparison to most interference magnetic fields, the absolute difference of the averaged magnetic field magnitude (i.e., reference magnetic field magnitude) and the current magnitude field magnitude can indicate whether or not the magnetometer's readings are corrupted by an interference magnetic field. By comparing this absolute difference D when the sensor device 100 is experiencing interference and when it is not, a suitable threshold ε can be determined for the desired application. As an example and not a limitation, ε=0.03. An appropriate difference D between the reference magnetic field magnitude and the current magnetic field magnitude for most applications may be the absolute difference, although other distance metrics could be used.

The process of flowchart 200 starts at block 202, such as when the sensor device 100 is initialized. At block 204, the reference magnetic field magnitude is initialized and determined. This process should be completed in the absence of interference magnetic fields to achieve an accurate reference magnetic field magnitude that is representative of the Earth's magnetic field. At block 204, several current magnetic field magnitudes may be determined and averaged to calculate the reference magnetic field magnitude. It is noted that, before implementing the process, several parameters should be chosen appropriately for the desired application. The number of iterations used for initialization of the reference magnetic field magnitude, n, should be small enough that the start-up process is not too long. However, it also should be long enough to establish an accurate average magnitude for comparison. The exact value may depend on factors such as the number of measurements per second the magnetometer will make, the anticipated rate of change in orientation or position, and the type of average that is being calculated to compute the reference magnetic field magnitude (i.e. a running average, a weighted average, and the like). During the initialization process at block 204, the only calculations being performed are the calculation of the current magnitude and the average magnitude to determine the reference magnetic field magnitude.

Further with respect to calculating the reference magnetic field magnitude, it may be continuously updated during operation of the sensor device 100 at block 26. As an example and not a limitation, one way to calculate the reference magnetic field magnitude, either at block 204 or block 216, is by the following equation:

$$m_{ref} \leftarrow \alpha_{compass} * m_{ref} + (1 - \alpha_{compass}) * m; \quad \text{Eq. (1),}$$

where:
← is the assignment operator,
$m_{ref}$ is the reference magnetic field magnitude,
m is the current magnetic field magnitude, and
$\alpha_{compass}$ is a predetermined value.

The parameter $\alpha_{compass}$ is used to determine how quickly the reference magnetic field magnitude may change. In one embodiment, the parameter or $\alpha_{compass}$ ranges in between zero and one, though the formula could be adjusted to accommodate other ranges. The parameter or $\alpha_{compass}$ determines how much memory the reference magnetic field magnitude will have. If it is close to one, the reference magnetic field magnitude will change very slowly and stay close to its initialized value longer. If it is close to zero, the value will change very quickly. It is noted that if the parameter or $\alpha_{compass}$ is given a value of one, the equation will simplify and the reference magnetic field magnitude will remain the value to which it was initialized. Therefore, this value should be set to something less than one; however, it is recommended that the value be large enough to avoid having the reference magnetic field magnitude itself corrupted by an interference magnetic field. As a non-limiting example, one recommended value is 0.97. It should also be noted that the technique for calculation during the initialization stage may be different from Eq. (1), but it need not be if an appropriate $\alpha_{compass}$ is chosen. If $\alpha_{compass}$ is chosen to be a lower value during initialization, such as 0.9, the reference magnetic field magnitude will be able to converge quickly.

It is also noted that after initialization (block 204), the technique provided by Eq. (1) has the advantages of computational efficiency and lower memory requirements over calculating the average over a number of stored previous magnitudes, as well as the advantage of control of memory fading over a running average.

After initialization of the reference magnitude at block 204, the processor at block 206 receives a current magnetic field magnitude. In some embodiments, the current magnetic field reading (including both magnitude and direction) is stored in a time delay table at block 208, which is described in more detail below.

The process then moves to block 210 where it is determined whether or not the current magnetic field magnitude is close to the reference magnetic field magnitude. In other words, it is determined if the current magnetic field magnitude is close to that of the magnitude of the Earth's magnetic field at the particular geographical location of the sensor device 100. in some embodiments, the difference D, between the magnitude (or similar norm) of the current magnetic field magnitude of the magnetometer 110, m, and the reference magnetic field magnitude (norm), $m_{ref}$, is compared to an experimentally determined threshold, $\epsilon$. If D>$\epsilon$, it is likely that the magnetometer 110 is experiencing interference. In some embodiments, a variable indicates that D>$\epsilon$. Once interference is detected, the trust level may be adjusted accordingly (i.e., decreased at block 214). The trust level may be adjusted prior to any use of the magnetometer readings to avoid the use of corrupted data. Block 212 illustrates a waiting mechanism that delays when the trust level may be increased at block 214. Examples of this waiting mechanism are described below.

Possible Trust Level Adjustments

The methods with which the trust level is adjusted (blocks 214, 215) are independent of the detection method. One method is to set the trust level to a defined minimum trust value at block 215 and to switch it back to a default level (i.e., maximum trust value) after the interference magnetic field is no longer detected. For instance, if the application involves sensing orientation, and there is the possibility of strong magnetic interference during operation, the minimum trust value may be set to zero when a corrupting field is detected. The sensor device 100 may rely on other sensors (e.g., accelerometer(s) 108 and/or gyroscopes(s) 106) and time propagation at during the time when the trust level is set to the minimum trust level. When the detection method (e.g., block 210) indicates that the magnetometer 110 has not been corrupted for a suitable period of time (i.e. a waiting period), the sensor device 100 may switch back to trusting the magnetometer at some chosen default level (i.e., a maximum trust level). The waiting period may be provided so that a single false negative will not affect the orientation calculation.

Another method of adjusting the trust level of the magnetometer 110 is to switch to the minimum trust level and to slowly converge back to the maximum trust value over a convergence period. This method may be implemented in a number of ways. As a non-limiting example one method is to choose a number of consecutive, interference-free iterations to converge back to the maximum trust level. For each consecutive iteration without interference, the trust level of the magnetometer may be raised using the following equation providing a convergence period:

$$T \leftarrow T_{min} + \left(1 - \frac{I}{I_{max}}\right) * (T_{default} - T_{min}); \qquad \text{Eq. (2)}$$

where:
  T is the trust value,
  $T_{min}$ is the minimum trust value,
  $T_{max}$ is the maximum trust value,
  $I_{max}$ is a number of consecutive iterations to return the trust value to the maximum trust value $T_{max}$, and
  I is a number of iterations remaining to return the trust value to the maximum trust value $T_{max}$.

It is noted that, in the beginning of the waiting period, I=$I_{max}$ and that as I converges toward zero, the trust value T converges toward $T_{default}$, which may be the maximum trust value.

It should be understood that other ways to gradually converge the trust value back to the default trust value are possible. An alternative technique is to make the rate of change in the trust value T increase as the number of iterations gets closer to $I_{max}$. However, this may not be necessary for most applications if a suitable waiting period is observed before the process of increasing trust level begins.

Waiting Period to Leave Interference-Free Mode

There are also many possible ways of determining the waiting mechanism provided at block 212. In some embodiments, the waiting mechanism could be configured as a counter or a variable which acts as a test to indicate when the magnetometer 110 will be, or will begin to be, increased to the default value (i.e., the maximum trust value). As an example, consider a variable $L_{ignore}$, which is given a value such as one whenever interference is detected, and then slowly decays according to an equation, such as:

$$L_{ignore} \leftarrow \alpha_{ignore} * L_{ignore} \qquad \text{Eq. (3),}$$

where:
  $L_{ignore}$ indicates a current state of the waiting period and is set to a maximum value when the difference between the current magnetic field magnitude and the reference magnetic field magnitude is greater than the threshold, and
  $\alpha_{ignore}$ determines how quickly $L_{ignore}$ decays.

The variable $L_{ignore}$ will be compared to some fixed value to see if it has decayed sufficiently to determine that the sensor device 100 is outside of the interference magnetic field 192. This method may be useful in some applications, as it provides more control over the waiting mechanism than a simple counter scheme. It should be understood that similar decay equations could be substituted depending on the application.

Time Delayed Magnetometer Data

Because the magnetometer's trust level is not adjusted until the given threshold is reached or exceeded, disturbances under the threshold can appear in magnetometer data and be fully trusted in final orientation data. In many use cases, significant disturbances from an interference magnetic field under the threshold would appear immediately before a significant disturbance that is over the threshold. This is the case if a magnet or other object which can cause a disturbance is suddenly brought close to the magnetometer, as the disturbances will start under the threshold, and will quickly rise above the threshold, assuming the threshold has been set properly to account for objects which cause that magnitude of disturbance.

This issue may be accounted for by providing an optional time delay between when the current magnetic field magnitude is detected by the magnetometer and when the orientation of the sensor device is computed. This may reduce the affect on disturbances that are close, but under, the threshold from adversely affecting the computed orientation. There are many ways to achieve such as time delay. In one non-limiting example, all magnetometer readings are stored when they are initially read either for some number of iterations or some fixed amount of time before applying them to the orientation calculation. This gives interference detection time to detect any disturbances and to properly adjust the trust level before the magnetometer data is used to calculate any other piece of data. As an example, one method is to store newly acquired current magnetic field readings into a time delay table (block 208), which may be stored in memory 104. Before calculating the orientation using the current magnetic field reading, the time delay table is accessed for the oldest current magnetic field reading that has been in the time delay table for a required amount of time, such as a time delay threshold (block 218). This delays the use of any magnetometer readings for the required amount of time, thereby becoming more resistant to disturbances that are below the threshold.

The process may continue at block 220, where the orientation of the sensor device 100 is calculated using the magnetometer readings and the magnetometer trust value, as well as readings from the one or more gyroscopes 106 and the one or more accelerometers 108, if provided. Any known or yet-to-be-developed method of calculating the orientation of the sensor device 100 may be utilized. After calculating the orientation of the sensor device 100, an output signal of the orientation is provided at block 222.

The process continues to block 224, which repeats the process as long as necessary. The breaking condition indicated at block 224 could be any given breaking condition, such as the loop having run for a predetermined amount of time, or no breaking condition at all, in which case the loop may continue indefinitely. If the breaking condition at block 224 occurs, the process ends at block 226, at which point al calculation stops.

It is to be understood that the preceding detailed description is intended to provide an overview or framework for understanding the nature and character of the subject matter as it is claimed. It will be apparent to those skilled in the art that various modifications and variations can be made to the embodiments described herein without departing from the spirit and scope of the present disclosure. Thus, it is intended that the claimed subject matter cover the modifications and variations of this disclosure provided they come within the scope of the appended claims and their equivalents.

It is noted that terms like "commonly," when utilized herein, are not intended to limit the scope of the claimed subject matter or to imply that certain features are critical, essential, or even important to the structure or function of the claimed subject matter. Rather, these terms are merely intended to highlight alternative or additional features that may or may not be utilized in a particular embodiment.

The invention claimed is:

1. A sensor device to measure orientation comprising:
 a plurality of sensing devices including a magnetometer and one or more from a group of an accelerometer and a gyroscope, wherein the magnetometer measures a magnetic field and produces a magnetic field reading including at least a magnitude of the magnetic field;
 a processor, wherein the processor is communicatively coupled to the plurality of sensing devices by a communication bus, wherein each sensing device provides a signal over the communication bus to the processor representing a physical orientation of the sensor device; and
 a non-transitory computer-readable memory storing instructions that, when executed by the processor, cause the processor to:
  receive a current magnetometer reading including at least a current magnetic field magnitude as detected by the magnetometer;
  detect a presence of the sensor device within an interfering magnetic field based on comparing a difference between the current magnetic field magnitude and a reference magnetic field magnitude with a threshold;
  adjust a trust value of the magnetometer such that the trust value is decreased in response to the sensor device being detected within the interfering magnetic field based on the difference between the current magnetic field magnitude and the reference magnetic field magnitude being greater than or equal to the threshold;
  increase the trust value when: the sensor device is detected outside the interfering magnetic field based on the difference between the current magnetic field magnitude and the reference magnetic field magnitude being less than the threshold, the trust value is less than a maximum trust value, and following a waiting period beginning when the difference between the current magnetic field magnitude and the reference magnetic field magnitude was last above the threshold;
  switch between the signals of the plurality of sensing devices to compute an orientation of the sensor device based at least on the trust value, wherein the trust value affects a reliance on magnetic field readings in computing the orientation of the sensor device; and
  provide an output signal, wherein the output signal indicates the orientation of the sensor device.

2. The sensor device of claim 1, wherein the waiting period is defined by:

$$L_{ignore} \leftarrow \alpha_{ignore} * L_{ignore},$$

where:
 $L_{ignore}$ indicates a current state of the waiting period and is set to a maximum value when the difference between the current magnetic field magnitude and the reference magnetic field magnitude is greater than the threshold, and
 $\alpha_{ignore}$ determines how quickly $L_{ignore}$ decays.

3. The sensor device of claim 1, wherein the trust value is equal to zero after the trust value is decreased, and the trust value is equal to one after the trust value is increased.

4. The sensor device of claim 1, wherein the trust value ranges from a minimum trust value to the maximum trust value.

5. The sensor device of claim 4, wherein the trust value is increased by converging the trust value from the minimum trust value to the maximum trust value over a convergence period so long as the difference between the current magnetic field magnitude and the reference magnetic field magnitude is not greater than the threshold during the convergence period.

6. The sensor device of claim 5, wherein the minimum trust value is equal to zero and the maximum trust value is equal to one.

7. The sensor device of claim 1, wherein the trust value is equal to zero after the trust value is decreased, and the trust value is equal to one when the trust value is increased.

8. The sensor device of claim 1, wherein the reference magnetic field magnitude is determined by:

$$mref \leftarrow \alpha compass * mref + (1-\alpha compass) * m,$$

where:
mref is the reference magnetic field magnitude, m is the current magnetic field magnitude, and αcompass is a predetermined value.

9. The sensor device of claim 1, wherein a time delay exists between when the current magnetic field reading is detected by the magnetometer and when the current magnetometer reading is used to compute the orientation of the sensor device.

10. The sensor device of claim 1, wherein the instructions further cause the processor to:
receive a plurality of magnetic field readings from the magnetometer;
store, in the non-transitory computer-readable memory, the plurality of magnetic field readings in a time delay table; and
select, as the current magnetic field reading, an oldest magnetic field reading from the plurality of magnetic field readings stored in the time delay table according to a time delay threshold.

11. The sensor device of claim 1, wherein the orientation of the sensor device is based on one or more outputs from at least one from a group of the accelerometer and the gyroscope.

12. A sensor device to measure orientation comprising:
a plurality of sensing devices including a magnetometer and one or more from a group of an accelerometer and a gyroscope, wherein the magnetometer measures a magnetic field and produces a magnetic field reading including at least a magnitude of the magnetic field;
a processor, wherein the processor is communicatively coupled to the plurality of sensing devices by a communication bus, wherein each sensing device provides a signal over the communication bus to the processor representing a physical orientation of the sensor device; and
a non-transitory computer-readable memory storing instructions that, when executed by the processor, cause the processor to:
receive a current magnetometer reading including at least a current magnetic field magnitude as detected by the magnetometer;
detect a presence of the sensor device within an interfering magnetic field based on comparing a difference between the current magnetic field magnitude and a reference magnetic field magnitude with a threshold;
adjust a trust value of the magnetometer such that the trust value is decreased in response to the sensor device being detected within the interfering magnetic field based on the difference between the current magnetic field magnitude and the reference magnetic field magnitude being greater than or equal to the threshold;
increase the trust value when: the sensor device is detected outside the interfering magnetic field based on the difference between the current magnetic field magnitude and the reference magnetic field magnitude being less than the threshold, the trust value is less than a maximum trust value, and following a waiting period beginning when the difference between the current magnetic field magnitude and the reference magnetic field magnitude was last above the threshold, wherein:
the trust value ranges from a minimum trust value to the maximum trust value,
the trust value is increased by converging the trust value from the minimum trust value to the maximum trust value over a convergence period so long as the difference between the current magnetic field magnitude and the reference magnetic field magnitude is not greater than the threshold during the convergence period, and
the convergence period is defined by:

$$T \leftarrow Tmin + (1 - I/Imax) * (Tdefault - Tmin),$$

where:
T is the trust value,
Tmin is the minimum trust value,
Tdefault is the maximum trust value,
Imax is a number of consecutive iterations to return the trust value to the maximum trust value, and
I is a number of iterations remaining to return the trust value to the maximum trust value;
switch between the signals of the plurality of sensing devices to compute an orientation of the sensor device based at least on the trust value, wherein the trust value affects a reliance on magnetic field readings in computing the orientation of the sensor device; and
provide an output signal, wherein the output signal indicates the orientation of the sensor device.

13. The sensor device of claim 12, wherein I=Imax when it is determined that the difference between the current magnetic field magnitude and the reference magnetic field magnitude is greater than the threshold, and the trust value T converges toward the maximum trust value as I converges toward zero.

14. The sensor device of claim 12, wherein the instructions further cause the processor to:
receive a plurality of magnetic field readings from the magnetometer;
store, in the non-transitory computer-readable memory, the plurality of magnetic field readings in a time delay table; and
select, as the current magnetic field reading, an oldest magnetic field reading from the plurality of magnetic field readings stored in the time delay table according to a time delay threshold.

15. The sensor device of claim 12, wherein the orientation of the sensor device is based on one or more outputs from at least one from a group of the accelerometer and the gyroscope.

16. A method of computing an orientation of a sensor device comprising a plurality of sensing devices and a processor communicatively coupled to the plurality of sensing devices by a communication bus, wherein the plurality of sensing devices includes a magnetometer and one or more from a group of an accelerometer and a gyroscope with each sensing device providing a signal over the communication bus to the processor representing a physical orientation of the sensor device, the method comprising:

receiving by the processor a plurality of magnetic field readings from the magnetometer, each magnetic field reading comprising at least a magnetic field magnitude;

storing by the processor, in a non-transitory computer-readable memory, the plurality of magnetic field readings in a time delay table;

selecting by the processor, as a current magnetic field reading, an oldest magnetic field reading from the plurality of magnetic field readings stored in the time delay table according to a time delay threshold;

detecting by the processor a presence of the sensor device within an interfering magnetic field based on comparing a difference between the current magnetic field magnitude and a reference magnetic field magnitude with a threshold;

adjusting by the processor a trust value of the magnetometer such that the trust value is decreased in response to the sensor device being detected within the interfering magnetic field based on the difference between the current magnetic field magnitude and the reference magnetic field magnitude being greater than or equal to the threshold;

switching between the signals of the plurality of sensing devices for computing an orientation of the sensor device based at least on the trust value, wherein the trust value affects a reliance on magnetic field readings in computing the orientation of the sensor device; and providing an output signal, wherein the output signal indicates the orientation of the sensor device.

17. The method of claim 16, further comprising increasing the trust value when the difference between the current magnetic field magnitude and the reference magnetic field magnitude is less than the threshold, the trust value is less than a maximum trust value, and following a waiting period beginning when the difference between the current magnetic field magnitude and the reference magnetic field magnitude was last above the threshold.

18. The method of claim 16, wherein a time delay exists between when the current magnetic field reading is detected by the magnetometer and when the current magnetometer reading is used to compute the orientation of the sensor device.

* * * * *